United States Patent [19]
Miyamoto

[11] Patent Number: 4,843,388
[45] Date of Patent: Jun. 27, 1989

[54] ROTARY ENCODER, AND METHOD OF MANUFACTURING SAME

[76] Inventor: Takehiko Miyamoto, 6-19, Shimoshakujii 1-chome, Neriam-ku, Tokyo, Japan

[21] Appl. No.: 46,931

[22] Filed: May 6, 1987

[30] Foreign Application Priority Data

May 12, 1986 [JP] Japan .................................. 61-106765
Jul. 7, 1986 [JP] Japan .................................. 61-157980

[51] Int. Cl.⁴ .............................................. H03M 1/24
[52] U.S. Cl. ...................................... 341/15; 360/77.06
[58] Field of Search ..................... 340/347 P; 318/568, 318/603; 360/77; 341/13, 14, 15

[56] References Cited

U.S. PATENT DOCUMENTS

4,543,621 9/1985 Lindberg et al. ...................... 360/77

Primary Examiner—William M. Shoop, Jr.
Assistant Examiner—Marc S. Hoff

[57] ABSTRACT

A rotary encloder includes a rotary disk for rotating by an amount proportional to movement of an object under control and having a magnetic body on a surface thereof, and a write/read head arranged at a position opposing the rotary disk on a radius of rotation thereof for writing position information into the magnetic body on the surface of the rotary disk and for reading written information from the magnetic body. The object is positioned at a control position, control position information for controlling the object is written by a writing portion of the magnetic head at a corresponding position on the rotary disk, and the written control position information is subsequently detected by a reading portion of the magnetic head, thereby detecting arrival at a control position of the object.

13 Claims, 7 Drawing Sheets

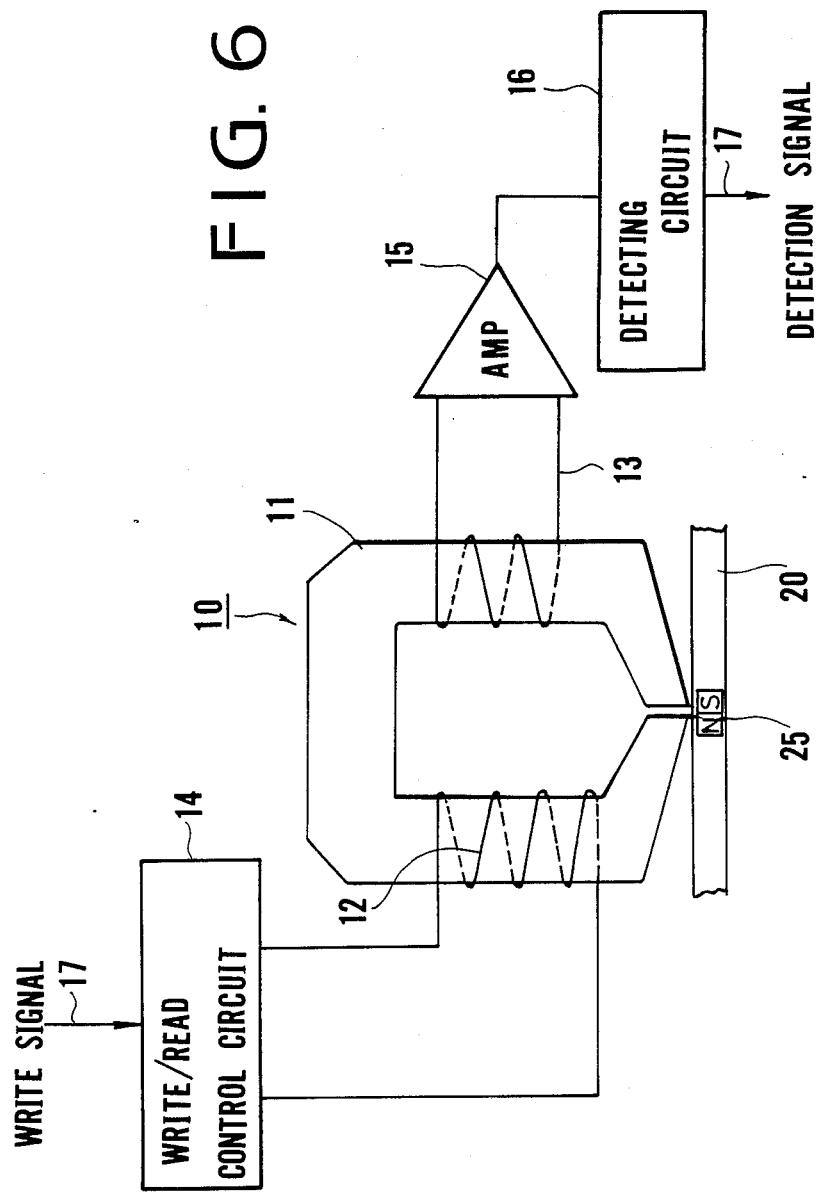

ROTARY ENCODER, AND METHOD OF MANUFACTURING SAME

BACKGROUND OF THE INVENTION

This invention relates to a rotary encoder capable of being positioned at a required position with high accuracy, and to a method of manufacturing the rotary encoder.

Along with the advances that have recently been made in the field of robots and automatic machines, encoders which serve as devices for detecting rotational and linear positions have come into wide use for the purpose of controlling those robots and machines. A great variety of such encoders are available. Incremental rotary encoders are the most commonly employed rotary encoders for measuring the displacement of a rotational angle. Such an encoder will now be described.

Rotary encoders presently available on the market are of two types, namely optical and magnetic. However, recent progress in the field of digital technology has produced a need for rotary encoders having high resolution and reliability.

For example, in the magnetic-type encoder, magnetic graduations indicative of position information are written into a rotary disk and the graduations are read by a magnetic head, which responds by outputting signals of the kind shown at X, Y and Z in FIG. 5, whereby position is detected. It should be noted that the left-hand portion of FIG. 5 is a timing chart for forward rotation, and the right-hand portion of FIG. 5 is a timing chart for reverse rotation. The direction of rotation can be identified by comparing the two signals X and Y. When the signal Z is outputted, this indicates that the rotary disk is at a one-revolution initial position.

However, in order to obtain a high resolution with a disk of the same shape and size, the pitch of the signal generating sources generally must be reduced. This leads to a weakening of the generated signals and a deterioration in the S/N ratio, resulting in a decline in reliability. In addition, a high processing speed is required and the associated control circuitry is complicated and costly. The processing speed can be lowered by reducing the number of output pulses per revolution, resolution declines and positioning precision suffers.

By way of example, consider a rotary encoder which generates 1000 pulses per revolution. If a motor on which such an encoder is mounted is a high-speed motor that rotates at 6000 rpm, the pulses outputted by the encoder will have a frequency of 100 KHz. By comparison, a rotary encoder having a resolution of 10,000 pulses per revolution will produce output pulses having a frequency of 1 MHz at the same rotational speed of 6000 rpm.

In order to use such a high-resolution encoder mounted on a high-speed motor as is strongly demanded, a high-performance computation control circuit capable of executing processing at a very high speed must be provided to process the output pulses from the encoder. Such processing is not possible with an ordinary microcomputer.

Moreover, no matter how much the pitch is reduced to raise resolution, the control position is at best an approximate position with respect to an ideal position and does not always agree with the required position information.

FIGS. 9 and 10 illustrate the construction of an optical disk used in a conventional optical rotary encoder of the type most widely employed in the art.

As shown in FIGS. 9 and 10, an optical disk 100 is fixedly secured on a drive shaft 110 which rotates in response to movement of an object under control, the shaft 110 passing through the center of the disk 100. The optical disk 100 is formed to include slits 101 in the thickness direction thereof through which a beam of light is allowed to pass, the light beam being blocked by the solid portions of the disk body between the slits. The slits 101, which extend radially of the disk 100, are arranged along the entire circumference of the disk at a prescribed radius from the center thereof and are angularly spaced at a predetermined angle $\alpha$. The slits 101 and intervening solid portions need only transmit and block the light beam and can consist of alternately arranged transparent and opaque portions, respectively.

As shown in FIG. 10, the optical disk 100 is interposed between a light-emitting element 105, which produces the aforementioned light beam, and a light-receiving element 106 arranged to oppose each other at the portion of the disk where the slits 101 are provided. When the optical disk 100 rotates, the light beam from the light-emitting element 105 passes through the slits 101 to impinge upon the light-receiving element 106 and is blocked from the light-receiving element 106 by the solid portions of the disk 100 between the slits 101. Thus, the light-beam from the light-emitting element 105 is allowed to impinge upon the light-receiving element alternatingly. By thus sensing the light beam, the light-receiving element 105 makes it possible to detect the amount by which the optical disk 100 rotates.

In the case of a magnetic-type rotary encoder, magnetic graduations are recorded on a rotatable disc in advance by applying a highly coercive magnetic material to the disc at positions corresponding to the circumferential positions at which the slits 101 of optical disc 100, shown in FIG. 9, are located, or by applying the magnetic material to the peripheral surface of the disc at the abovementioned positions. These magnetically recorded graduations are read by a magnetic head arranged at a predetermined position opposing the circumferential edge portion of the disc or at a predetermined position opposing the peripheral surface of the disc. The amount of disc rotation is detected by e.g. counting the number of pulses produced in accordance with the amount of disc rotation.

However, the spacing between adjacent slits in the optical system or between the adjacent magnetic graduations in the magnetic system is a certain fixed angle, denoted by $\alpha$ in FIG. 9, and the accuracy with which an angular position can be expressed is decided by this angle $\alpha$. In other words, expressing a position within the angle $\alpha$ (i.e. obtaining a position detection accuracy smaller than $\alpha$) is impossible. In order to improve accuracy, the slit pitch must be reduced (i.e. the number of slits must be increased) to make $\alpha$ smaller.

Mechanically speaking, this demands higher machining and assembly precision. Electrically speaking, reducing the size of the slits results in less light passing through the slits and worsens the S/N ratio. Consider a case where an optical-type incremental rotary encoder is used, position is detected at a point where the encoder shaft rotates through 90° and rotation is stopped at this point. If the encoder outputs 400 pulses per revolution, then rotation should be stopped at a position detected to be 100 pulses from a reference point. However, only the 100th pulse is actually needed, the 1st through 99th pulses not being directly required. Nevertheless, all of these pulses must be constantly monitored in the conventional arrangement. Furthermore, if it is attempted to stop rotation at the 89° position and not the 90° position, this cannot be accomplished because there is no slit at the 89° position. Thus, stopping rotation at an arbitrary position is impossible.

SUMMARY OF THE INVENTION

An object of the present invention is to provide an encoder in which position information can be written at any required position, and the position information read and detected, whereby desired position control can be achieved reliably and efficiently.

Another object of the invention is to provide an encoder capable of readily detecting position information and of performing desired position control reliably and efficiently by being equipped with a rotary disk which rotates by an amount that corresponds to rotation of an object under control and which has position information written into a predetermined circumferential surface on a radius of rotation, first reading means for reading position information written into the rotary disk, writing means for writing position information, separate from that of the first-mentioned position information, into the rotary disk at any desired position, and second reading means for reading the position information written by the writing means.

A further object of the present invention is to provide a method of manufacturing a rotary encoder in which position information can be written at any desired position, whereby position information can be written, in a state where the encoder is mounted on an object under control, after the object is positioned at a control position, thus making accurate positioning possible.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 6 is a schematic view illustrating a write/read head and a controller therefor;

DESCRIPTION OF THE PREFERRED EMBODIMENT

An embodiment of the invention will now be described in detail with reference to the drawings.

Figure 2:
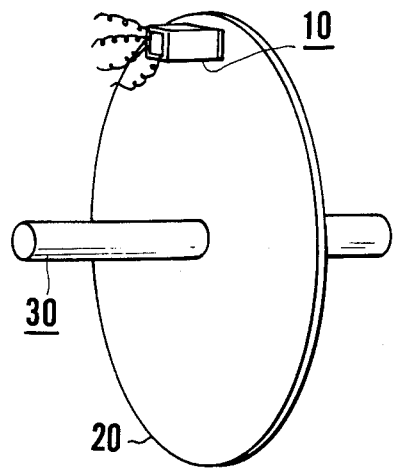
FIG. 2 is a view showing the relationship between a rotary disk and magnetic head according to the embodiment of the invention.

FIG. 2 illustrates the positional relationship between a rotary disk and a magnetic head according to an embodiment of the invention. Numeral 10 denotes a write/read head, 20 a magnetic disk, and 30 a drive shaft which rotates by an amount corresponding to the amount of movement of an object under control. The surface of the disk 20 on at least a circumferential portion thereof having a predetermined radius and indicated by the phantom line is coated with a magnetic material possessing a strong coercive force. The magnetic head is disposed at a position opposing the magnetic material-coated surface, as shown in FIG. 2. Position information is recorded on the disk 20 at desired positions in the form of a magnetic signal by the magnetic head 10. Locations from which this recorded position information is subsequently read serve as desired locations. It should be noted that the position information on the magnetic disk 20 is not limited to desired position information; control can be performed in such a manner that reference position information is written onto another track, or such that reference position information is written onto the disk in advance following by writing in desired position information. In particular, if the rotary encoder is applied in direct positional control of an object such as a robot arm that does not make more than one revolution, the encoder can be greatly simplified and improved in accuracy.

As a result, control for designating a stopping position can be executed with great accuracy, and it is possible to realize a rotary encoder equivalent to one having slits recorded at a theoretically limitless pitch.

Furthermore, if a magnetic recording is made on the disk only at the required locations, unnecessary detection signals will not be outputted and control for counting these signals can be dispensed with, unlike the case with the conventional rotary encoder. Arrival at a desired position can be determined based on arrival of a single detection signal. Accordingly, in a control unit using the encoder, interrupt pending processing is executed for the required signal, during which time other processing and control can be performed. This enables a computer or the like to be utilized very effectively and makes it possible to greatly simplify the control program.

Figure 5:
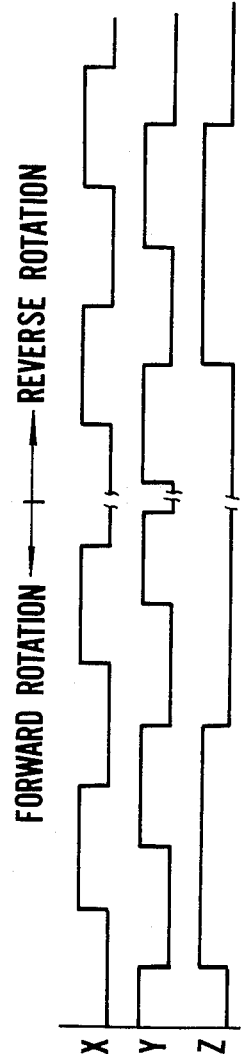
FIG. 5 is a timing chart illustrating the reading of position information of an ordinary encoder.

If position information is written not only at the required positions but also on other tracks, the magnetic head 10 can be equipped with a read head portion for the required tracks, e.g. for three tracks, and a write/read head for one track, with control being performed in such a manner that the position information X, Y and Z shown in FIG. 5 is read by the read head portion.

Figure 1:
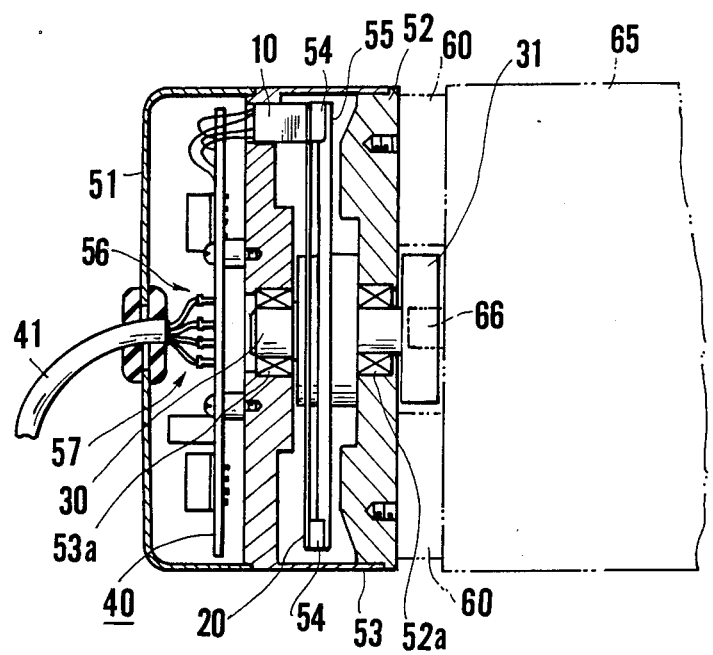
FIG. 1 is a sectional view illustrating an embodiment of a rotary encoder according to the present invention.

FIG. 1 is a sectional view of the encoder incorporating the magnetic head 10 and rotary disk 20.

The following description will deal with an encoder in which the magnetic head 10 has a three-track read head portion and a single-track write/read head portion.

In FIG. 1, numeral 20 denotes the rotary disk shown in FIG. 2, 30 the drive shaft for rotating the rotary disk 20 and supporting the disk at its center of rotation, 40 a control substrate for write/read control of the magnetic head 10, 41 an interface cable, 51 a protective cover for protecting the control substrate 40, and 52, 53 a support base and main support base for rotatably supporting the drive shaft 30. Further, numeral 54 denotes a ring-shaped sponge-like resilient body for bringing the magnetic disk 20 into pressing contact with the magnetic head 10 at a predetermined contact pressure, and numeral 55 represents a back plate for supporting the resilient body 54.

The magnetic head 10 is equipped with a three-track read head portion and a single-track write/read head portion. Magnetic graduations X, Y spaced apart at a certain fixed angle $\alpha$ are written beforehand through a well-known method on two tracks of the magnetic surface of rotary disk 20 at the position of the read head of magnetic head 10, and a reference position signal Z indicating a reference position of the magnetic disk is written on the magnetic surface of the disk at the position of the other read track. The signals X, Y and Z are as shown in FIG. 5 similar to prior art.

In accordance with this embodiment, position information D is recorded, in addition to the abovementioned conventional magnetically recorded graduations, in the form of a magnetic signal at an arbitrary position of a magnetic body on a circumferential portion of the magnetic head 10 at the position of the write/read head portion. Thereafter, this previously recorded position information D and the read positions of the position information X, Y written through the conventional method are investigated, whereby desired position detection and positioning are carried out.

Figure 3:
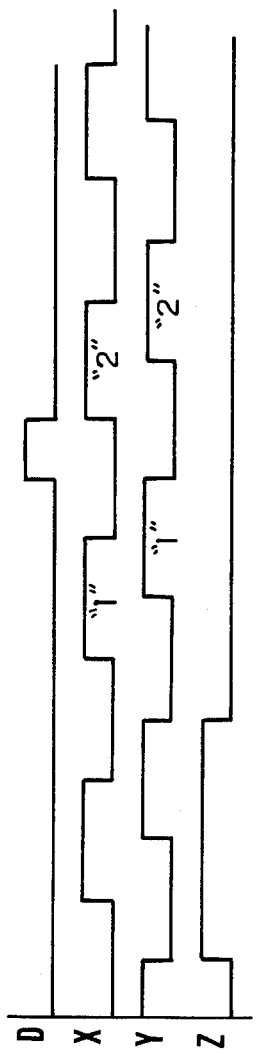
FIG. 3 is a timing chart illustrating the reading of position information according to the embodiment of the invention.

A reading timing chart in accordance with the embodiment is illustrated in FIG. 3. The signal D is a read pulse of a magnetic signal written in anew by the magnetic head 10 of the embodiment. It should be noted that the timing chart of FIG. 3 holds for forward rotation.

Figure 4:
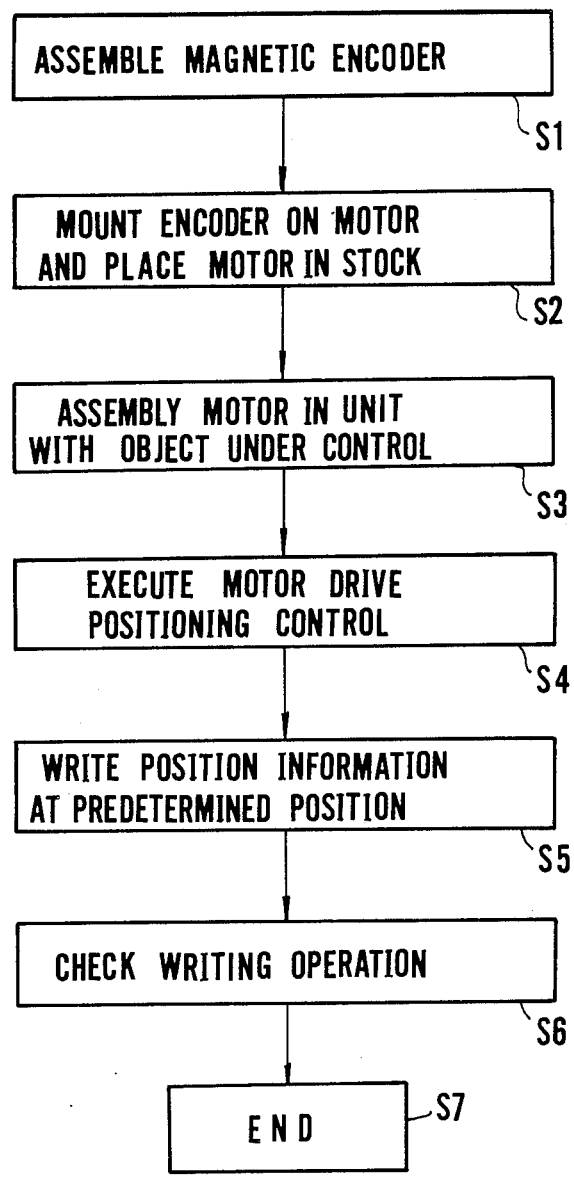
FIG. 4 is a view of a rotary encoder manufacturing process according to the embodiment of the invention.

The rotary encoder is assembled in a state where the magnetically recorded graduations are written on the rotary disk 20 in the three tracks for X, Y and Z by a well-known method. This is step S1 in FIG. 4. The magnetically recorded graduations need not have the resolution desired by the end user. It is sufficient to provide magnetic graduations common for all coarse precisions in a range that will assure high reliability. This is the condition in which the rotary encoder is made available to e.g. servomotor manufacturers (step S2 in FIG. 4). The servomotor manufacturer installs these encoders in the servomotors of it product line without taking a customer's specifications into account. These servomotors are kept in stock from which sales are made. Specifically, the encoder main base 53 and support base 52 are secured to a servomotor 65 via a mounting fitting 60, as shown by the dashed lines in FIG. 1, and the drive shaft 30 is connected to a drive shaft 66 of the servomotor 65. This is the condition in which the servomotors are kept in stock.

When a servomotor has been delivered to a customer from stock, the customer, in accordance with the required specifications, unites the motor with the object to be controlled (step S3). The motor is driven (step S4) to actually move the object to the desired position. For example, in an apparatus for controlling an object through a well-known teaching function, the object is positioned by being moved to the desired position manually or in small increments. When the object has been brought to the desired position to end the positioning operation, a magnetic head write control circuit on the control substrate 40 is energized to write the magnetic graduations into the rotary disk 20 at the aforementioned position (step S5). It will suffice if an object control unit, not shown, stores the positional relationship between the position written at the magnetic graduation and the previously written magnetic graduations X, Y, Z. For example, in FIG. 3, the position at which the magnetic graduation D is written lies between the first and second X following the detection of Z and between the first and second Y following the detection of Z.

To position the object at the desired position by driving the motor, the read signals X, Y, Z are monitored to prepare for the arrival of the first X and first Y by detection of Z following detection of a desired rotational number of rotation. If the motor rotates at high speed, a required amount of deceleration is applied before the appearance of X and Y. When X and Y are detected for the first time, D is then monitored. When D is detected, positioning of the object at the desired position ends. At this time a check is performed to make sure that the object has been brought to the desired position (step S6). If the object has been brought to the desired position, control for the writing of information on the rotary disk 20 is ended (step S7).

If the result of position control is that the object is not at the desired position, the magnetic graduation which has been written is erased and is written again. A rotary encoder the specifications whereof conform to the needs of the customer can thus be provided.

When the above-described write control operation ends, it will suffice to effect control in such a manner that the write control circuit on control substrate 40 is not energized. This is to prevent subsequent inadvertent writing from readily taking place.

The write/read head portion is equipped with an erase head for simultaneously erasing position information.

In accordance with the present embodiment described above, the magnetic graduations of X, Y, Z are written beforehand at a high output level at a pitch which does not require a high resolution and does not involve the likelihood of recognition error. It will suffice if this is applied commonly for all encoders irrespective of the various positional accuracies demanded by customers. This makes it possible to reduce the number of component parts. By writing position information into a desired position by the write/read head portion, highly precise position control can be carried out and it is possible to realize a rotary encoder equivalent to one having magnetic graduations recorded at a theoretically limitless pitch.

Accordingly, a rotary encoder which outputs pulses at a low frequency can be obtained even if the motor has a high rpm and a high resolution is required. If a conventional rotary encoder having a resolution of 10,000 pulses per revolution is mounted on a high-speed motor that rotates at 6000 rpm, the pulses outputted by the encoder will have a frequency of 1 MHz. However, in accordance with the illustrated embodiment of the invention, position information indicative of D can be written at the necessary position even if X and Y are written at a resolution of 100 or fewer pulses per revolution. An encoder can be obtained having a positioning accuracy greater than that of an encoder whose resolution is higher than 10,000 pulses per revolution. Thus, it is possible to realize a simple positioning control unit which does not require high speed.

Control will now be described for a case where the magnetic head 10 is equipped only with a single-track write/read head to perform magnetic recording only at a required location.

FIG. 6 is a block diagram showing the magnetic head 10 and the control circuit on the control substrate 40. The magnetic head 10 is provided with a read coil 11 and a write/read changeover drive coil 12. When a write signal 17 arrives from a control unit, not shown, a write/read control circuit 14 causes a strong current to flow into the write/read changeover drive coil 12, thereby magnetizing a magnetic body, as shown at e.g. 25, on the rotary disk 20. When the write signal 17 vanishes, the strong current for the writing operation ceases to flow.

It should be noted that control can be performed to effect magnetization only at the leading edge of the write signal 17.

In the absence of the write signal 17, a weak current which will not demagnetize the magnetized position information (mark) flows into the write/read changeover drive coil 12. The state of a magnetic flux generated in the core 11 of the magnetic head 10 by this weak current is monitored at all times by the read coil 11, the detected amount of flux is amplified by an amplifier 15, and a detecting circuit 16 performs a monitoring operation to determine if the flux changes in excess of a predetermined amount. When the previously magnetized position information 25 arrives at a position below the face of the magnetic head 10, as shown in FIG. 6, a change is produced in the flux in core 11. This is detected by the detecting circuit 16 via the read head 11 and amplifier 15, the circuit 16 outputting a detection signal 18. It should be noted that the detecting circuit 16 is well-known and need not be described here.

In a case where the above information is recorded together with a reference position, the recording of the reference position and the other recordings are compared and the direction of magnetization is reversed or the strength of magnetization is increased in order to distinguish between the reference position and other recorded positions.

Figure 7:
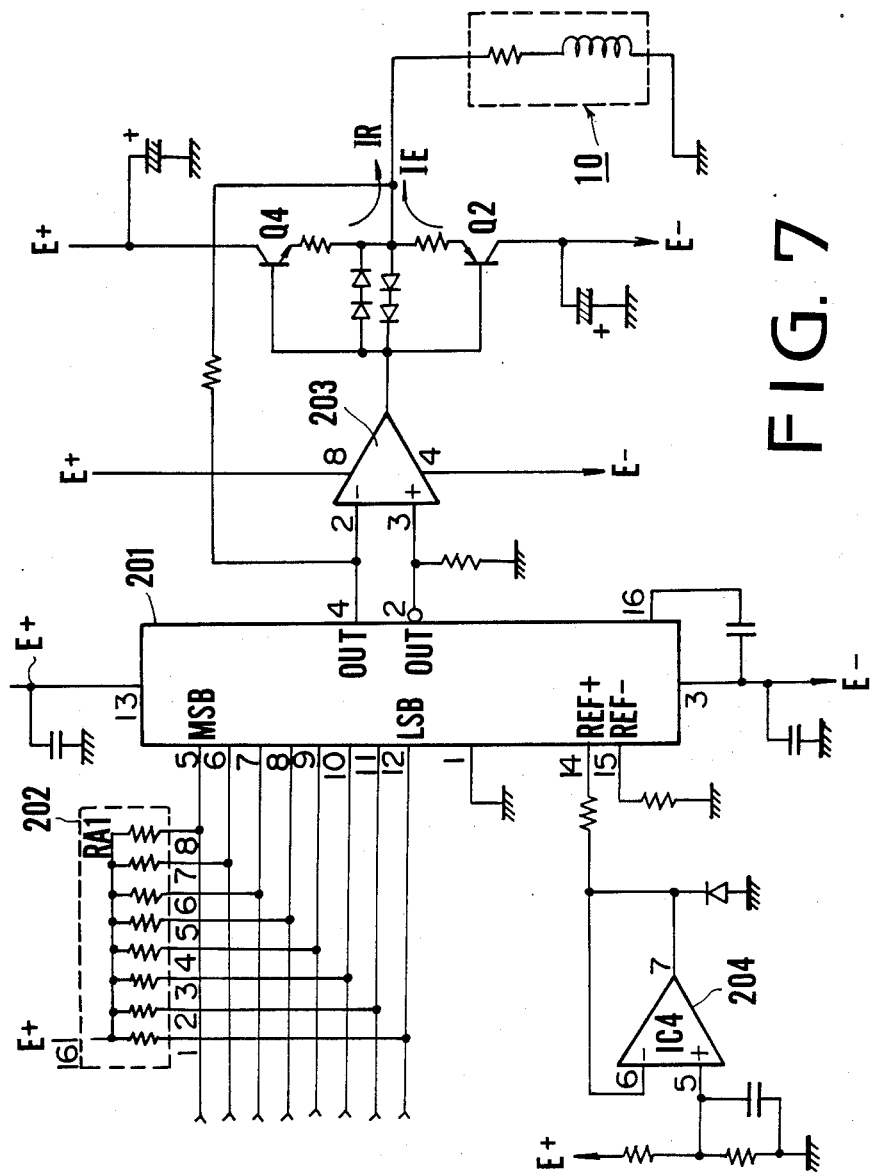
FIG. 7 is a detailed circuit diagram of a write/erase control section for the write/read head shown in FIG. 6.

FIG. 7 illustrates an example of a position circuit of the write/read control circuit 14. If the head 10 is expressed as an equivalent circuit, the result will be resistance and reactance components, as shown in FIG. 7. In the present embodiment, the write head portion of the write head 10 is used for both recording and erasing. The recording current is $I_R$ in response to conduction of a transistor Q4 and the erasing current $I_E$ in response to conduction of a transistor Q2. In this embodiment, $|I_R| = |I_E|$.

In FIG. 7, numeral 201 denotes a D/A converter IC for head drive, a desired example of which is the uPD624C manufactured by NEC. Numerals 203, 204 denote ICs, a desired example of which is the μPD4570C, manufactured by NEC. Preferred as the transistors Q2, Q4 are the ISA1154KA and 2SC2721KA, respectively.

The output value changes in accordance with digital input values MSB–LSB applied to the D/A converter 201, thereby making it possible to select between a recording output and erasing output.

Figure 8:
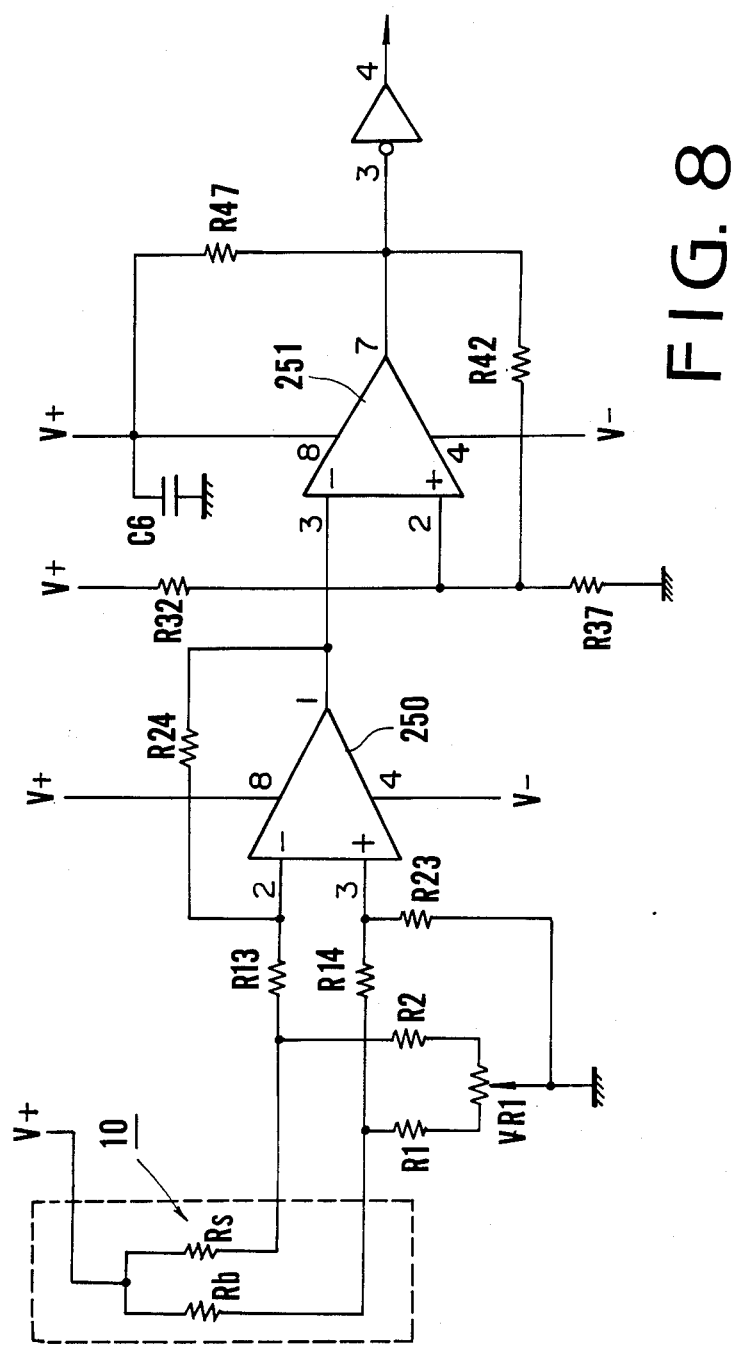
FIG. 8 is a read head control circuit diagram according to the embodiment of the invention.
Figure 9:
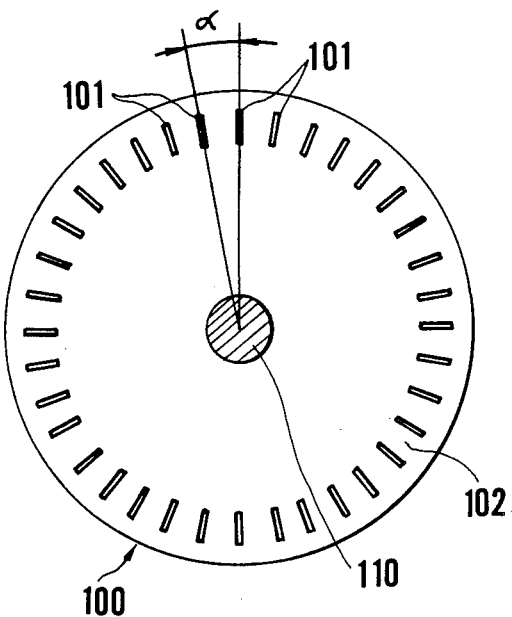
FIG. 9 is a schematic view of a conventional optical-type rotary disk.
Figure 10:
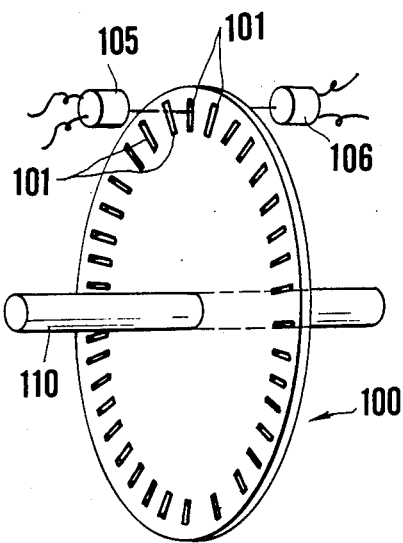
FIG. 10 is a view showing the relationship between a conventional optical rotary disk and a magnetic head.

FIG. 8 illustrates the details of the detecting circuit of the read head for reading position information written by the write head portion or prewritten position information and the like.

Since the circuit for detecting the change in flux in the case where the read head has the construction shown in FIG. 6 is well-known, a description of this circuit is deleted. An example where the read head is constituted by an MR element will now be described with reference to FIG. 8.

If illustrated in the form of an equivalent circuit, the MR element is expressed as $R_b$, $R_s$, as shown in FIG. 8. When no signal is being detected, the following will hold, by way of example: $R_{b0} 32 R_{s0} \pm 20\%$ (where $R_s = R_{s0}$, $R_b = R_{b0}$). At detection of a signal, $R_b = R_{b0}$, $R_s = R_{s0}(1-\alpha)$ will hold, and $\alpha$ will have a value of 0.02.

In order to detect a change in the value of $\alpha$ effectively, a bridge circuit is constructed using $R_b$, $R_s$ and resistances $R_1$, $R_2$, $VR_1$. A change in the input potential of an amplifier 250 due to a change in the resistance ratio of $R_b$ to $R_s$ is amplified by the amplifier 250, the output whereof is converted into a binary value, inverted and amplified by an inverting amplifer 251. The output of amplifier 251 is converted back into a potential by an inverter 252 before being outputted. In the foregoing description, the invention is applied to a rotary encoder, which is used upon being mounted on e.g. the drive shaft of a motor. However, what is moved in response to movement of the object under control is not limited to a rotary disk. If the object is one which undergoes e.g. linear motion, a linear encoder can be realized by arranging a magnetic head at a predetermined position opposing a detecting plate, which is coated with a magnetic body in stripe-like form, adapted to move in accordance with the movement of the object under control.

Encoders of the type described above can of course be used upon being mounted on servomotors for positional control of various industrial machines and robots. They can be employed generally as positioning mechanisms for all types of moving objects.

In accordance with the present invention as described above, there is provided a simply controllable encoder capable of detecting the desired position of an object with great accuracy.

As many apparently widely different embodiments of the present invention can be made without departing from the spirit and scope thereof, it is to be understood that the invention is not limited to the specific embodiments thereof except as defined in the appended claims.

What we claim is:

1. A rotary encoder for controlling the movement and stopping position of an object under control of said rotary encoder which is adapted to be controlled by said rotary encoder comprising:

a rotary disk having a magnetic surface area deposited thereon for recording signals, and having a drive shaft for said rotary disk being adapted for rotating said rotary disk by an amount proportional to movement of an object under control of said rotary encoder; and a write/read head means arranged at a position opposing said rotary disk on a radius of rotation thereof for writing signals indicative of disk position information on the surface of said rotary disk and for reading written information from the rotary disk as magnetic graduations indicative of positional information which can be read by said write/read head means;

control point writing means for writing at least one control movement and stopping position information signal on said magnetic surface area for controlling the object to be controlled by said rotary encoder including a writing portion of said write/- read magnetic head positioned at a corresponding writing position for said rotary disk, said write/read head means being constructed and adapted for reading after a control movement and stopping position information signal is written to read the information supplied by the said movement and stopping position information signal by a reading portion of said write/read magnetic head means, thereby detecting arrival at a control position of the object to be controlled by said rotary encoder when said object is coupled to said drive shaft of the rotary encoder.

2. The rotary encoder according to claim 1, wherein said magnetic graduations indicative of written position information are indicative of reference position information and desired position information.

3. A rotary encoder for outputting a control position information signal for controlling the movement and stopping position of an object under control of said rotary encoder which is adapted to be controlled by said rotary encoder, comprising:

a rotary disk which rotates by an amount that is proportional to and corresponds to the linear movement or rotation of the object to be controlled by said rotary encoder and which has position information written into a predetermined circumferential magnetic surface on a radius of rotation;

first reading means for reading position information written into said rotary disk;

control location writing means for writing initially an arbitrary and desired controlled object position location information signal on said rotary disk corresponding and relating to a specific arbitrary and desired location position of the object to be controlled by said rotary encoder at a location on said disk separate from that of the first-mentioned position information; and second reading means for reading the said arbitrary and desired controlled object position location information signal written by said location writing means, said controlled object position location information signal being arbitrary and independent of any prior position information written into said rotary disk and being adapted to mark the actual location of a position of the said object to be controlled at an arbitrary time and location and being adapted to be initially written at said arbitrary time and location of the object to be controlled while being adapted to be read by said second reading means at a time subsequent to said arbitrary time to enable repeated determination of the actual location and to enable the control of movement and stopping of said object to be controlled after the initial controlled object position location information signal has been written on said rotary disk as an output location information signal from said rotary encoder.

4. The rotary encoder according to claim 3, wherein said rotary disk has a magnetic coating on the predetermined circumferential surface thereof, said position information a magnetic recording written the magnetic coating, and wherein said first and second reading means include a read magnetic head for reading the magnetic recording written into the magnetic coating, said writing means includes a write magnetic head for writing the magnetic memory into the magnetic coating at any position thereof, and wherein said output location information signal is a pulse signal.

5. A method of manufacturing a rotary encoder and controlled subsystem having an object to be under control, comprising the steps of:

(a) assembling a magnetic encoder unit which includes a control circuit and a rotary disk;

(b) coupling the magnetic encoder unit, assembled via step (a), to a driving source which is part of said controlled subsystem having said object to be placed under control and making a coupling between said rotary disk and said driving source;

(c) positioning the object to be placed under control at a desired control point position thereby causing the position of the rotary disk to change to correspond to a change in position of the object; and (d) writing control point position information of the rotary disk at a position resulting from the position operation of said step (c) to thereby fix a control point for the position of said object and to enable the said rotary encoder to control said controlled subsystem to repeatedly position the said object at the position set by the operation of said step (c).

6. A method of manufacturing a rotary encoder and controlled driving source for an object to be controlled by said rotary encoder, comprising the steps of:

(a) assembling a magnetic encoder unit which includes a control circuit and a rotary disk;

(b) coupling the magnetic encoder, assembled via step (a), to said driving source;

(c) assembling the driving source, to which the magnetic encoder has been coupled via said step (b), into a unit having said object to be controlled;

(d) positioning the object, assembled in said step (c), at a desired arbitrary control point position and causing the magnetic disk to move correspondingly to a position associated with the said desired control point of the said object; and (e) causing the said magnetic encoder unit to write position control point information for detection at said position of the magnetic disk positioned in said step (d) which is associated with the said desired control point position of said object to enable the said magnetic encoder unit to suquentially repeatedly position said object at said control point.

7. The rotary encoder according to claim 1, wherein said object under control said rotary encoder is an element which is subject to rotation and said movement and stopping position information signal when written determines the amount of rotational movement and position for stopping rotational movement of said object.

8. The rotary encoder according to claim 1, wherein said object under control of said rotary encoder is an element which is subject to linear movement and said movement and stopping position information signal when written determines the amount of linear movement and position for stopping the linear movement of said object.

9. The rotary encoder according to claim 3, wherein said object under control of said rotary encoder is an element which is subject to rotation and said movement and stopping position information signal when written determines the amount of rotational movement and position for stopping rotational movement of said object.

10. The rotary encoder according to claim 3, wherein said object under control of said rotary encoder is an element which is subject to linear movement and said movement and stopping position information signal when written determines the amount of linear movement and position for stopping the linear movement of said object.

11. The rotary encoder according to claim 1, wherein said rotary disk is provided with a circumferential coating of magnetic material of relatively high coercivity, and said movement and stopping position information signal is written onto said high coercivity material with a recording current sufficient to magnetize and record said signal in said area of relatively high coercivity.

12. The method of manufacturing according to claim 5, further comprising,
   a step of writing position information at a predetermined pitch on said magnetic disk at a location different from the location destined to record said control point position information, positional information for generally outputting positional information from said magnetic disk, said positional information being recorded on said magnetic disk before the recording of said control point positional information.

13. The method of manufacturing according to claim 6, further comprising,
   a step of writing position information at a predetermined pitch on said magnetic disk at a location different from the location destined to record said control point position information, positional information for generally outputting positional information from said magnetic disk, said positional information being recorded on said magnetic disk before recording of said control point positional information.

* * * * *

UNITED STATES PATENT AND TRADEMARK OFFICE
CERTIFICATE OF CORRECTION

PATENT NO.  : 4,843,388
DATED       : June 27, 1989
INVENTOR(S) : Takehiko Miyamoto It is certified that error appears in the above-identified patent and that said Letters Patent is hereby corrected as shown below:

On the title page:

--Assignee: Kabushiki Kaisha Empire Airport Service, Tokyo, Japan--.

Signed and Sealed this

Twenty-eighth Day of January, 1992

*Attest:*

HARRY F. MANBECK, JR.

*Attesting Officer*   *Commissioner of Patents and Trademarks*